United States Patent [19]

Yao et al.

[11] Patent Number: 4,885,542

[45] Date of Patent: Dec. 5, 1989

[54] MRI COMPENSATED FOR SPURIOUS NMR FREQUENCY/PHASE SHIFTS CAUSED BY SPURIOUS CHANGES IN MAGNETIC FIELDS DURING NMR DATA MEASUREMENT PROCESSES

[75] Inventors: Ching Yao, Belmont; James D. Hale, Berkeley; Lawrence E. Crooks, Richmond; Leon Kaufman, San Francisco, all of Calif.

[73] Assignee: The Regents of the University of California, Berkeley, Calif.

[21] Appl. No.: 181,440

[22] Filed: Apr. 14, 1988

[51] Int. Cl.$^4$ .......................................... G01R 33/20
[52] U.S. Cl. ...................................... 324/313; 324/307
[58] Field of Search ............... 324/300, 307, 309, 318, 324/319, 320, 322, 312, 313

[56] References Cited

U.S. PATENT DOCUMENTS

| | | | |
|---|---|---|---|
| 4,698,591 | 10/1987 | Glover et al. | 324/318 |
| 4,703,275 | 10/1987 | Holland | 324/322 |
| 4,740,753 | 4/1988 | Glover | 324/318 |
| 4,761,612 | 8/1988 | Holland et al. | 324/322 |

Primary Examiner—Michael J. Tokar
Attorney, Agent, or Firm—Nixon & Vanderhye

[57] ABSTRACT

At least one extra NMR measurement cycle is performed without any imposed magnetic gradients during readout and recordation of the NMR RF response. Calibration data derived from this extra measurement cycle or cycles can be used for resetting the RF transmitter frequency and/or for phase shifting other conventionally acquired NMR RF response data to compensate for spurious changes in magnetic fields experienced during the NMR data measuring processes. Some such spurious fields may be due to drifting of the nominally static magnetic field. Another source of spurious fields are due to remnant eddy currents induced in surrounding conductive structures by magnetic gradient pulses employed prior to the occurrence of the NMR RF response signal. Special procedures can be employed to permit the compensation data itself to be substantially unaffected by relatively static inhomogeneities in the magnetic field and/or by differences in NMR spectra of fat and water types of nuclei in imaged volumes containing both.

36 Claims, 9 Drawing Sheets

MRI COMPENSATED FOR SPURIOUS NMR FREQUENCY/PHASE SHIFTS CAUSED BY SPURIOUS CHANGES IN MAGNETIC FIELDS DURING NMR DATA MEASUREMENT PROCESSES

This invention is generally related to magnetic resonance imaging (MRI) utilizing nuclear magnetic resonance (NMR) phenomena. It is more particularly directed to apparatus and method for practicing MRI which provides compensation for spurious NMR frequency/phase shifts caused by spurious changes in magnetic fields during NMR data measurement processes.

This application is related to the commonly assigned concurrently filed application Ser. No. 07/181,386 (refiled as Ser. No. 07/283,059) to Yao entitled MRI USING ASYMMETRIC RF NUTATION PULSES AND/OR ASYMMETRIC SYNTHESIS OF COMPLEX CONJUGATE SE DATA TO REDUCE TE AND T2 DECAY OF NMR SPIN ECHO RESPONSES in that the invention therein described may be conveniently employed concurrently with the present invention.

MRI is now a widely accepted and commercially available technique for obtaining digitized visual images representing the internal structure of objects (such as the human body) having substantial populations of nuclei which are susceptible to NMR phenomena. In general, the MRI process depends upon the fact that the NMR frequency of a given nucleus is directly proportional to the magnetic field superimposed at the location of that nucleus. Accordingly, by arranging to have a known spatial distribution of magnetic fields (typically in a predetermined sequence) and by suitably analyzing the resulting frequency and phase of NMR RF responses (e.g., through multi-dimensional Fourier Transformation processes), it is possible to deduce a map or image of relative NMR responses as a function of the location of incremental volume elements (voxels) in space. By an ordered visual display of this data in a suitable raster scan on a CRT, a visual representation of the spatial distribution of NMR nuclei across a cross section of an object under examination may be produced (e.g., for study by a trained physician).

Typically, a nominally static magnetic field is assumed to be homogeneous within the cross section to be imaged. In addition, typical MRI systems also superimpose magnetic fields of the same orientation but with intensity gradients which are assumed to vary linearly in predetermined directions (e.g., along mutually orthogonal x,y and z axes) while being constant and homogeneous in all other dimensions.

Unfortunately, the "real world" does not always conform exactly to these assumptions. In spite of several techniques known to and used by those in the art to substantially achieve these assumptions, there are inevitably small spurious changes which occur in the magnetic fields during NMR data measurement processes. For example, the nominal strength of the static field may drift with respect to time (less of a problem with cyrogenic super-conducting magnets than with permanent or resistive magnet embodiments). In addition, rapid imposition of a sequence of magnetic gradient fields produce eddy curren(s in nearby conductive members (e.g., the typically conductive containers for super-conducting magnet coils, the metal of a permanent magnet, etc.). The magnetic field produced by such eddy currents is, of course, directed so as to oppose the magnetic field which induced the eddy currents. To compensate for this effect, one conventional approach is to initially overdrive the magnetic gradient pulse so as to produce thedesired net magnetic gradient within the imaged volume.

Unfortunately, these eddy currents do not instantaneously vanish once the magnetic gradient pulses are switched off. Rather they more gradually die out and, as a result, there may be remnant magnetic fields still present (e.g., when the NMR RF response signal occurs. Typically, the magnetic gradient pulses used to achieve slice/volume selective NMR responses are of substantially greater intensity/duration than other magnetic gradient pulses and, accordingly, are often the principal source of spurious magnetic fields due to induced eddy currents.

The spurious changes in magnetic fields due to drift of the nominal static magnetic field are of much less significance with super-conducting magnets. For example, in low field permanent magnet MRI systems, the field drift over a scan sequence may be equivalent to a 100 Hertz NMR frequency shift which may cause partial dislocations of about 10% along the z-azis and 5% along the x-axis. However, for medium or high field cryogenic magnet MRI systems, the field drift over an entire day may be only 20 Hertz or so. Accordingly, this problem is of more concern with lower strength permanent magnet MRI systems.

On the other hand, spurious changes in magnetic fields caused by remnant eddy currents have been and remain more of a problem with super-conducting magnet structures than with permanent magnets (e.g., because more good electrically conductive material is generally present in cyrogenic super-conducting apparatus). Phase shift errors of as much as about 200 degrees or so have been observed at the beginning of the typical spin echo sampling window time (which errors gradually decay during the sampling window as the remnant eddy currents die out).

Thus, although perhaps for several different reasons, an ability to compensate for spurious changes in magnetic fields should be of benefit in all types of MRI systems.

Where the FID is recalled (i.e., by reversed gradient pulses rather than the production of a true spin echo with a 180° RF pulse) the phase errors caused by spurious fields are of enhanced importance. This is because the recalled FID immediately follows both the rephasing slice gradient and a dephasing readout gradient. It is inherently more sensitive to static or transient inhomogeneity of the field since there is no 180° RF pulse.

In some super-conducting magnets there is also another effect. The gradient pulsing may cause a dynamic or transient change of the field strength. In some way (perhaps by exerting forces on the magnet winding that moves it around in the cryostat) the pulsing gradients cause the field to change to a new value while the scan is running. Once the gradient pulses stop, the field returns to the pre existing quiescent value. This dynamic change is repeatable for the same gradient pulses and is different when different shape, duration or direction pulses are used. Thus, a phase correction would be of benefit when scans of the same orientation are used where some gradient parameters change and one wants the images from the different scans to register with one another.

The fact that eddy currents can produce phase problems in MRI is known in the prior art (see, for example, "NMR Velocity-Selective Excitation Composites for Flow and Motion Imaging and Suppression of Static Tissue Signal" by Moran et al, IEEE Trans. In Med. Imaging, Vol MI-6, No. 2, June 1987, pp 141–147 at p 142). However, earlier proposed solutions, to the extent there are any, appear to focus primarily upon techniques for better achieving the assumed ideal magnetic field distributions. For example, U.S. Pat. No. 4,300,096 - Harrison et al is directed towards techniques for closed loop control systems aimed at achieving matched shape and magnitude of various magnetic gradient pulses in an MRI system. U.S. Pat. Nos. 3,495,162 - Nelson and 3,496,454 - Nelson also teach prior NMR spectrometer systems which attempt to achieve improved homogeneity and constant magnetic field strength (e.g., by tracking a variable reference NMR frequency from a special NMR sample via a closed loop control channel).

It should also be noted that spurious phase errors in captured MRI data are especially bothersome where data conjugation techniques are utilized to synthesize data (based upon assumed symmetry properties) thereby materially reducing the overall time required for capturing MRI data sufficient to generate an MRI image. Here, if there are spurious phase errors in the actually measured and collected data set, then the synthesized data set generated therefrom (e.g., by conjugation processes) will necessarily also include at least these phase errors. And since the phase errors do not exhibit the assumed theoretical symmetry underlying the synthesized conjugation process, the resulting synthesized data will be even more severely corrupted than would normally be expected due to spurious changes in magnetic fields. Accordingly, a technique for avoiding spurious frequency/phase errors would be of even greater advantage in MRI processes utilizing conjugate synthesized data (e.g., as described in U.S. Pat. No. 4,728,893 - Feinberg or in Margosian et al, "Faster MR Imaging Imaging With Half The Data", Health Care Instrumentation, Vol. 1, pages 195–197).

Those in the art will recognize that a "square" spectrum of RF frequencies (obtained by using a sinc-shaped RF pulse envelope in the time domain) may be used in conjunction with a slice-selective magnetic gradient to elicit RF spin echoes from a slice-volume of NMR nuclei. However, if there is no applied gradient during the SE readout, then the NMR frequency spectrum will immediately shrink to reflect the only remaining static magnetic field. If it is truly homogeneous, then it should have a substantially single frequency spectrum. In fact, this type of experiment has long been used to initially calibrate the MRI frequency versus slice location data initially before the first MRI scan of the day is performed. In this manner, the center frequency of the center slice position has been determined and used for thereafter establishing the RF transmitter center frequency.

Although techniques for better achieving the assumed ideal magnetic field distribution will continue to be of primary importance, we have discovered new techniques which permit one to compensate in other ways for spurious NMR frequency/phase shifts caused by spurious changes in magnetic fields during NMR data measurement processes in MRI.

In at least some typical MRI systems now commercially available (e.g., those available from Diasonics Inc), if an NMR spin echo response is recorded in the absence of any magnetic gradient pulse, then ideally the response will comprise only a very narrow band of frequencies (corresponding to the frequencies in the selected slice) and all of the sampled time domain responses will have the same zero relative phase. Accordingly, by actually taking such data in one or more extra "calibration" measurement cycle(s), and by noting the extent to which the detected frequency spectrum differs from the expected, and the extent to which the relative measured phase of the sampled RF signals differs from zero, one can derive compensation factors (a) to be applied to the already recorded data and/or (b) to reset the RF transmitter center frequency for subsequent NMR measurement cycles. Compensation to already collected spin echo data taken within a given measurement cycle can be made by appropriately phase shifting the data (either in the time domain or the frequency domain).

Unfortunately, the derived compensation factors may also be contaminated with errors caused by relatively static field inhomogeneities and/or by interference between the slightly different frequency signals emanating from fat-like and water-like nuclei in the imaged volume. Thus, especially where more exacting phase corrections are to be made (e.g. in compensation for eddy current effects), special inversion recovery and/or other changes are made in the NMR measurement cycles used to accumulate the compensation data so as to reduce or cancel such potential error sources. These as well as other objects and advantages of this invention will be more completely understood and appreciated by carefully studying the following detailed description of a presently preferred exemplary embodiment in conjunction with the attached drawings, of which:

Figure 1:
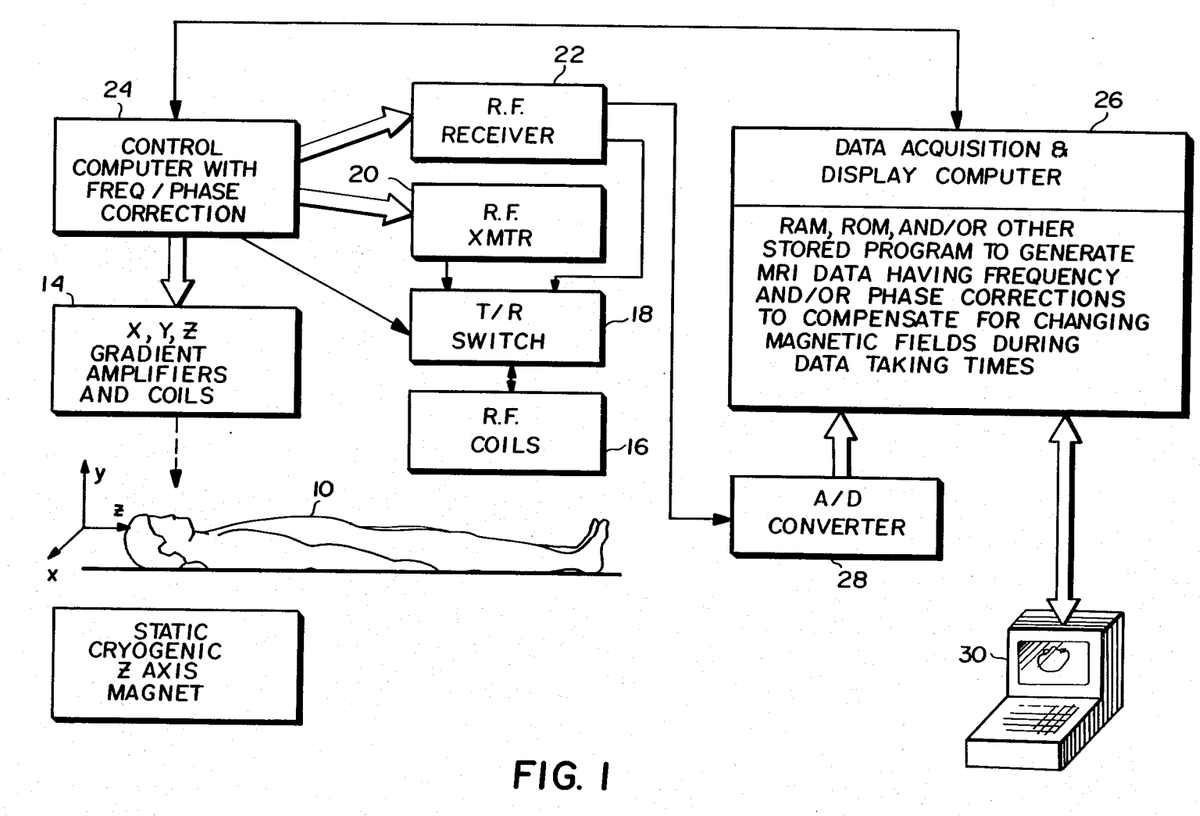
FIG. 1 is a generalized schematic block diagram of an MRI system modified so as to employ the presently preferred exemplary embodiment of this invention.

The novel signal processing and control procedures utilized in the exemplary embodiment typically can be achieved by suitable alteration of stored controlling computer programs in existing MRI apparatus. As one example of such typical apparatus, the block diagram of FIG. 1 depicts the general architecture which may be employed in such a system.

Typically, a human or animal subject (or other object) 10 is inserted along the z-axis of a static cryogenic magnet which establishes a substantially uniform magnetic field directed along the z-axis within the portion of the object of interest. Gradients are then imposed within this z-axis directed magnetic field along the x,y or z axes by a set of x,y,z gradient amplifiers and coils 14. NMR RF signals are transmitted into the body 10 and NMR RF responses are received from the body 10 via RF coils 16 connected by a conventional transmit/-receive switch 18 to an RF transmitter 20 and RF receiver 22.

All of the prior mentioned elements may be controlled, for example, by a control computer 24 which conventionally communicates with a data acquisition and display computer 26. The latter computer 26 may also receive NMR RF responses via an analog-to-digital converter 28. A CRT display and keyboard unit 30 is typically also associated with the data acquisition and display computer 26.

As will be apparent to those in the art, such an arrangement may be utilized so as to generate desired sequences of magnetic gradient pulses and NMR RF pulses and to measure NMR RF responses in accordance with stored computer programs. As depicted in FIG. 1, the MRI system of this invention will typically include RAM, ROM and/or other stored program media adapted (in accordance with the following descriptions) so as to generate phase encoded spin echoes during each of multiple measurement cycles within each of the possible succession of MRI data gathering scans (sometimes called "studies"). And to process the resulting MRI data into a final high resolution NMR image.

Figure 2:
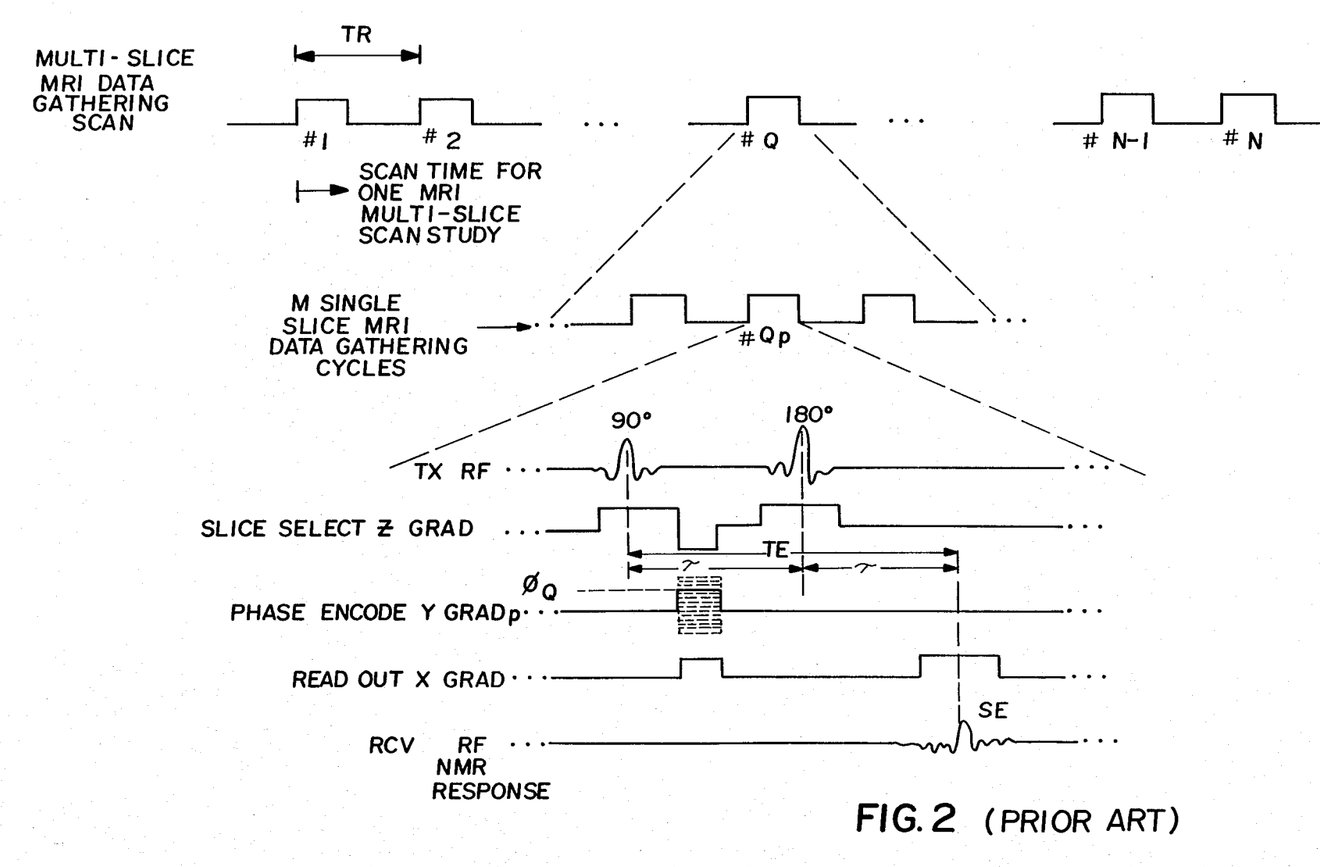
FIG. 2 is a diagrammatic depiction of prior art MRI data gathering sequences.

FIG. 2 depicts a typical prior art data acquisition sequence. Here, a single MRI data gathering scan or "study" involves a number N (e.g., 128 or 256) of successive data gathering cycles. In fact, if, as depicted in FIG. 2, a multi-slice scan is involved, then each of the N events comprising a single scan or "study" may actually comprise M single slice MRI data gathering cycles. In any event, for a given single slice data gathering cycle p, a slice selection z-axis gradient pulse (and associated phase correction pulse) may be employed to selectively address a transmitted 90° RF nutation pulse into a slice volume centered about the center frequency of the transmitted RF signal and of sufficient magnitude and duration so as to nutate a substantial population of nuclei within the selected slice-volume by substantially 90°. Thereafter, a y-axis gradient pulse is employed (of magnitude $\phi_Q$ for this particular cycle and varying between maximum magnitudes of both polarities over the N data gathering cycles for that particular slice) to phase encode the signal. After a predetermined elapsed time a 180° RF NMR nutation pulse will be transmitted to selectively excite the same slice volume (via application of the appropriate z-axis gradient) at a time tau. In accordance with the "rule of equal times," a true spin echo signal SE evolves, reaching a peak after a further elapsed time tau. During the recordation of the RF NMR response signal (where amplitude and phase of RF is measured at successive sample points), a readout x-axis magnetic gradient is employed so as to provide spatial frequency encoding in the x-axis dimension. Additional spin echo responses can also be elicited by the use of additional 180° nutation pulses or suitable other techniques —albeit they will be of decayed amplitude due to the NMR T2 decay.

The time-to-echo TE is depicted in FIG. 2 as is the repetition time TR. As just explained, TE interacts with the T2 NMR exponential decay parameter to reduce signal amplitude. The TR interacts with the T1 NMR exponential recovery parameter so that one generally has to wait for substantial relaxation of previously excited nuclei before the next measurement cycle of the same volume starts.

It will be noted that during each RF excitation pulse, there is a slice selection $G_z$ magnetic gradient pulse switched "on" so as to selectively excite only the desired "slice" or "planar volume" (e.g., a slice of given relatively small thickness such as 5 or 10 millimeters through the object being imaged). During each resulting spin echo NMR RF response, x-axis phase encoding is achieved by applying an x-axis magnetic gradient during the readout procedure (typically each spin echo pulse is sampled every 30 microseconds or so with digitized sample point, complex valued, data being stored for later signal processing).

As depicted in FIG. 2, it will be understood that, in practice, the number of measurement cycles typically is equal to the number of desired lines of resolution along the y-axis in the final image (assuming that there is no data synthesis via conjugation processing). After a measurement cycle is terminated with respect to a given "slice," it is allowed to relax for a TR interval (usually on the order of the relaxation time T1) while other "slices" are similarly addressed so as to obtain their spin echo responses. Typically, on the order of hundreds of such measurement cycles are utilized so as to obtain enough data to provide hundreds of lines of resolution along the y-axis dimension. A sequence of N such y-axis phase encoded spin echo signals is then typically subjected to a two-dimensional Fourier Transformation process so as to result in an N×N array of pixel values for a resulting NMR image in a manner that is by now well understood in the art.

Such prior art MRI techniques are based on the assumption (a) that the static magnetic field does not drift over the several minutes required for an entire MRI data gathering scan or "study" (or perhaps even a sequence of plural such scans) and (b) that the magnetic fields induced by remnant eddy currents do not introduce any phase error in the recorded spin echo signals (an assumption which is especially important where synthesized complex conjugate data are utilized).

In a super conducting magnet, static field drift compensation is probably not as important as compensation for spurious perturbations in recorded signal phase caused by remnant eddy currents induced in the cyrostat by pulsed magnetic gradients occurring prior to the recorded NMR response. The most significant remnant eddy current disturbance is caused by the strongest magnetic gradient pulses —namely, the slice selective ones.

On the other hand, in the typically lower field, permanent magnet MRI systems, while compensation for remnant eddy current effects can still be useful, compensation for drifting static magnetic field intensity (e.g., with respect to temperature) is probably more important.

Figure 3:
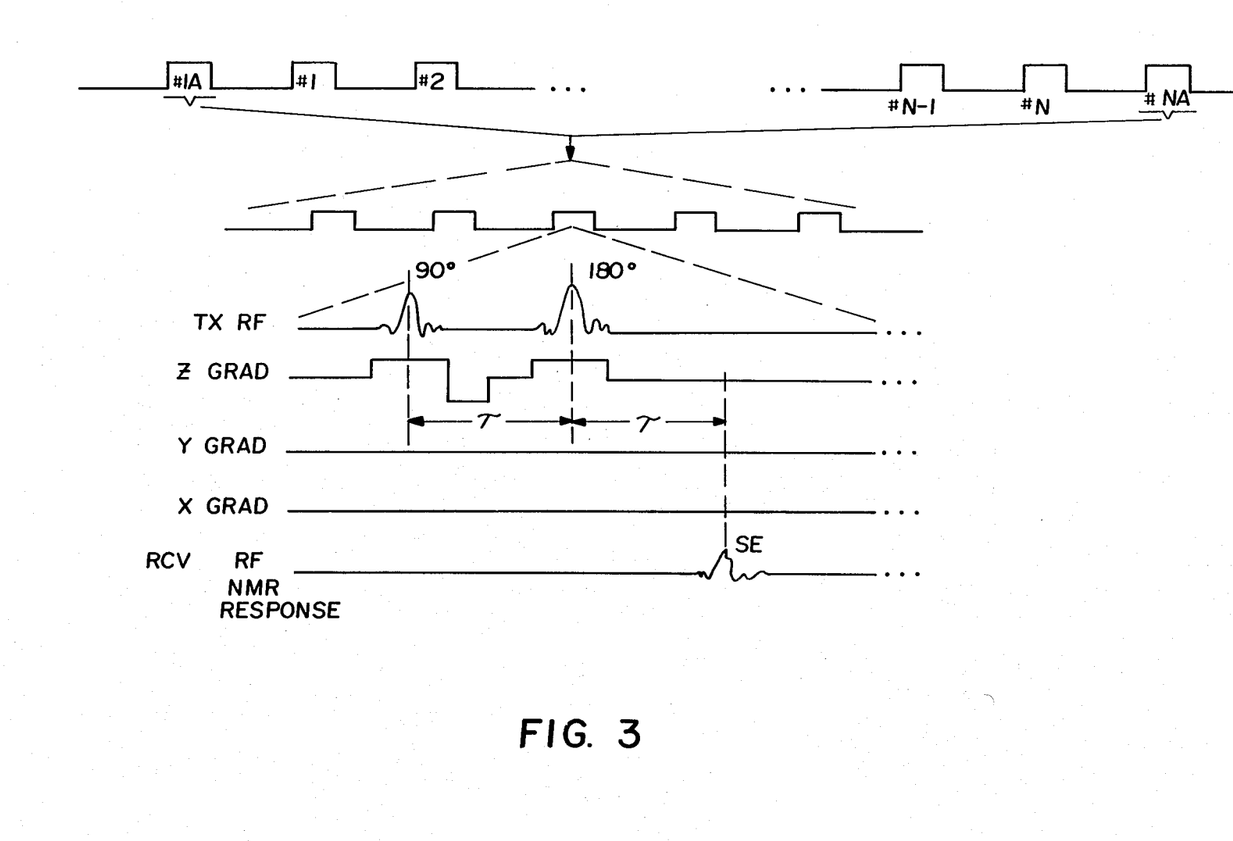
FIG. 3 is similar to FIG. 2 but additionally depicts exemplary extra measurement cycles taken at the beginning and at the end of a sequence of conventional measurement cycles comprising a complete MRI "scan," the extra measurement cycles being taken without the use of x and y magnetic gradient pulses.

The relatively weaker phase encoding $G_y$ and readout $G_x$ magnetic gradients produce less of an adverse phase perturbation effect and, if employed would tend to mask the phase and frequency of a desired compensation signal due to their normal phase and frequency encoding roles. Accordingly, in a preferred embodiment, at least one (preferably an extra first and an extra last) measurement cycle or "template" is provided in which at least the readout $G_x$ gradient (and preferably also the $G_y$ phase encoding gradient) is left "off" at least during the actual readout and recordation of the NMR response signal (and preferably at all times). One possible such calibration cycle is schematically depicted in FIG. 3.

In this way, a compensation or "calibration" NMR response "template" is obtained from each slice and recorded under influence only of the actual then-existing static field intensity and remnant fields related to eddy currents caused by the slice selective $G_z$ magnetic gradient pulses. If the static field strength has not changed from the initial set-up or calibration arrangement, and if there are no adverse fields due to remnant eddy currents, then the measured NMR response should have an expected frequency spectrum and phase. To the extent that this differs from the expected value, then correction or compensation data may be generated for use either in subsequent data gathering cycles and/or in the processing of already recorded NMR data so as to compensate for any spurious changes in magnetic fields during the just-completed earlier data measurement cycles.

When a drifting field strength is the main concern, the frequency spectrum of the spin echo during the "calibration" cycle where no phase encoding or readout gradient is employed (e.g., as in FIG. 3), is a measurement of the actual quiescent field strength. For example, the NMR spin echo elicited from a slice volume at the nominal center of the magnet effectively measures the field at this location. Spin echoes elicited during the "calibration" cycle from other slices located at distances from the center of the magnet will also vary in frequency due to inhomogeneities in the static magnetic field and due to fields caused by remnant eddy currents.

If, for whatever reason, the actual magnetic field distribution changes from the assumed ideal during the course of a scan sequence, then the frequency of the spin echo in the first extra "calibration" measurement cycle (e.g., see FIG. 3) will be different from that of the last extra calibration measurement cycle. If the frequency drift is assumed to be linear over the entire scan interval, then a corresponding incremental correction (proportional to the elapsed time from the beginning of the scan sequence and to the overall incremental change during the entire scan sequence) may be applied to all of the recorded data during its processing. Furthermore, if successive or multiple scans or "studies" are employed, a slow frequency drift (caused by field drift) will cause a given imaged object to effectively slide across the image space with respect to time such that given slice volumes effectively move with respect to a fixed spatial coordinate system as the NMR frequency changes in response to spurious magnetic field changes. This can be corrected by periodically resetting the center frequency of the RF transmitter during a sequence of scans.

The following equation expresses the resonant NMR frequency f in terms of nominal static magnetic field strength $H_o$, the assumed linear gradient magnitude G and position x:

$$f = \gamma H_o = \gamma G x \qquad \text{[Equation 1]}$$

Inverting this equation gives position x as a function of the nominal field strength $H_o$ and NMR frequency f:

$$x = f/\gamma G - H_o/G \qquad \text{[Equation 2]}$$

At the center position where $x = 0$, the NMR resonant frequency $f = \gamma H_o$. If field drift increases the actual field at the center of the magnet to value $H_o + \delta$, then the same NMR resonant frequency f actually corresponds to a position:

$$\begin{aligned} x &= f/\gamma G - (H_o + \delta)/G \\ x &= \delta/G \end{aligned} \qquad \text{[Equation 3]}$$

Accordingly, as the magnetic field strength drifts to higher values, the object effectively "slides" towards the negative x direction (assuming a positive x-axis gradient and negative frequencies in the minus x-axis dimension as measured from the center of the image space) and a slice volume corresponding to a given frequency comes from further back (in the negative z-axis direction) in the object.

In a multiple scan study, such effects can, in part, be reduced by appropriately changing the NMR system's center frequency (from which other RF transmit frequencies are relatively measured) before each new scan sequence is begun. For example, one may use a frequency measurement taken from the first and/or last "calibration" measurement cycles of one scan sequence so as to compute a new center frequency for use by the MRI system in the next subsequent scan sequence. Accordingly, each successive scan is at least recalibrated so as to effectively start at a common location thus "resetting" the imaged object back to a correct starting position.

Figure 4:
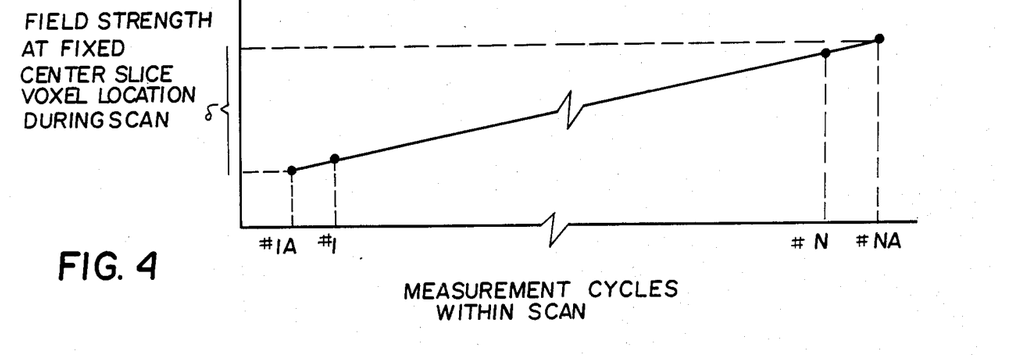
FIG. 4 depicts a simple linear model for assumed spurious field strength variations over time (e.g., with respect to a sequence of measurement cycles)

As to the effects of drift or changes occurring during a given measurement cycle, one may assume a simple linear model as depicted in FIG. 4. Here, it is assumed that the field strength at a given location changes linearly with respect to time by the amount δ over the entire sequence. The relative frequency/phase change then associated with each measurement cycle within the scan sequence may be approximated by the frequency/phase difference between the first and last calibration cycle divided by the number of cycles and added to the starting frequency. In this process, it is, of course, assumed that the drift or other spurious changes in the magnetic fields occurring during the approximately 10 to 100 milliseconds during which a spin echo NMR RF response is being recorded will be small compared to the changes which occur during the approximately 0.5 to 2 seconds TR time between measurement cycles. The recorded complex-valued RF sample signals can be multiplied by a suitable complex exponential of the appropriate frequency/phase so as to shift the effective frequency back to that corresponding to the first measurement cycle.

For example, consider the correction for cycle n out of N cycles where a total field drift is assumed to be δ. The relative frequency of the nth cycle is nδ/N. The measured signal in the time domain is donated as $S_n(t)$ and the corrected signal is $S_n'(t)$:

$$S_n'(t) = S_n(t) \exp(j[2\pi n\delta/N]t) \qquad \text{[Equation 4]}$$

A simple frequency shift of the Fourier Transform (i.e., in the frequency spectrum) of the measured signal is also possible. It may be done exactly if δ/N is exactly equal to a multiple of the frequency resolution employed in the system. If, as will probably be the case, it is not exactly related as an integer, then an approximate shift in the frequency domain can still be effected (with some acknowledged inaccuracy caused by this lack of precision).

In practice, the process can be done in a number of ways. The special "calibration" cycles such as depicted in FIG. 3 (i.e., those omitting at least some and preferably all of the magnetic gradient pulses —except for the slice selective gradient pulses which remain) may be interspersed within the normal scan sequence or may be tacked on to the beginning and/or end of such a sequence as should be apparent to those in the art in view of the above description. For example, if one desires 128 projections, then 130 measurement cycles may actually be employed so as to collect an additional first and last measurement cycle without x and y gradient pulses. These extra "calibration" measurement cycle data are stored on disc along with the other conventional 128 measurement cycle data and used by the MRI control computer to change the transmit frequencies used for subsequent scans.

The "calibration" data may also be used by the MRI array processor during image reconstruction so as to provide corrections. For example, the array processor may use them as soon as possible to produce a conventional 128 line image —thus, avoiding any requirement for the long term storage of extra image data. In another approach, the first and last "calibration" measurement cycles can be cycle numbers 1 and 128 so that only 126 phase encoded projections are actually acquired and used in the image reconstruction process. In this alternative, the array processor may fill the usual first and last data sets with zeros so that it will still conventionally process 128 projections —albeit there is meaningful information in only 126 of those projections. This will slightly reduce image resolution —but may be preferable for retrofitting existing MRI systems where disc files and the like are already formatted so as to accept a certain size data file (e.g., corresponding to 128 projections).

Although there are many ways to implement a suitable revision of the computer programming in a conventional MRI system so as to practice the invention, one exemplary embodiment may be realized using the "P command" syntax of the disclosed in commonly assigned U.S. Pat. No. 4,707,661 - Hoenninger, III et al. In this exemplary embodiment, the presence of phase encoding and readout gradients is controlled by suitable look-up tables. These tables are level dependent in the preexisting scheme as described in the just referenced patent. By adding a second level specification to the P command, the first and last measurement cycles of a given scan sequence may be caused to use a different set of tables (which happen to contain zero values) than for the remaining ones of the measurement cycles. For example, a new P command might be implemented as follows:

(P10:12)S5P13/P20(P21)S1:5P22;C1:128;L1,L3

In this example, L3 specifies a table pre-filled with zero values. The linker operating upon this new P command detects the double level (L1,L3) and links one cycle of the command with the table specified by the second level. This cycle is then loaded and executed. The sequencer stops and is loaded then with as many cycles at the first level as will fit. This continues until all of the first level cycles are done. Finally, the last measurement cycle with the second level tables is loaded and executed. It should be noted that the second level code should not be mixed with the first level code because the sub-routines may contain tables that would be different for each level and all the cycles in each load share the same subroutine code. For example, when the subroutine is loaded with the readout gradient turned off, all measurement cycles for this load will have the readout magnetic gradient turned off. Accordingly, this may only be a solitary first or last cycle in this example.

Figure 5:
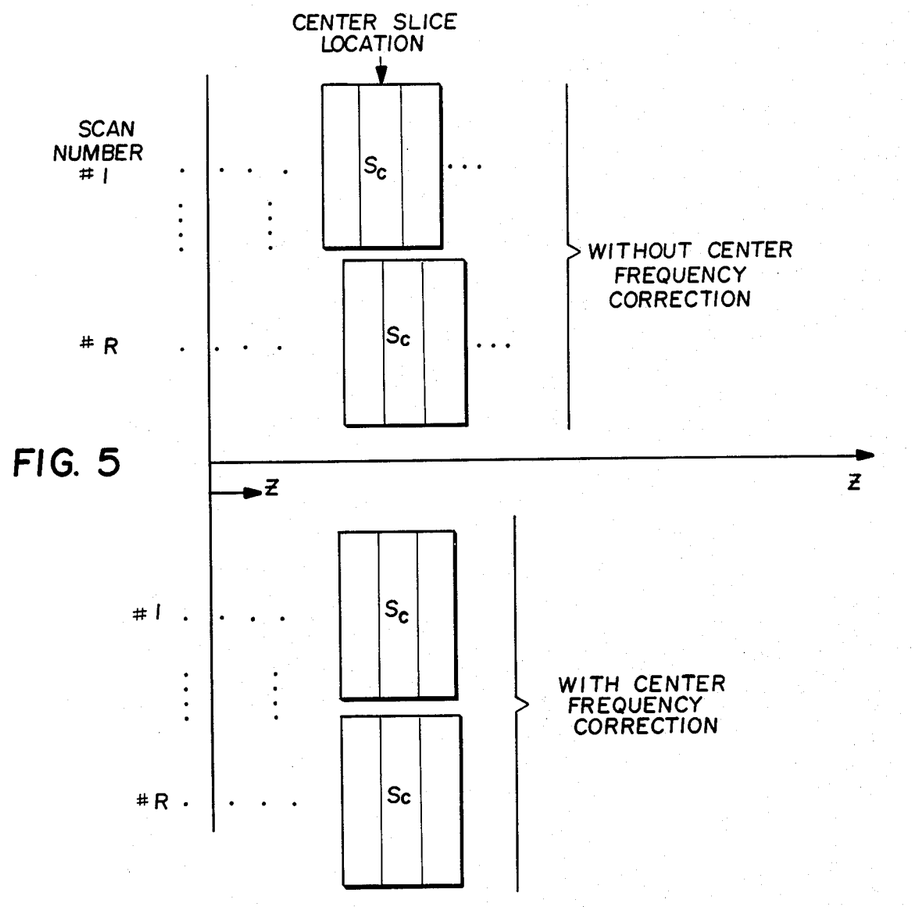
FIG. 5 schematically depicts the effective shifting of slice volume locations over a multi-scan sequence without center frequency correction and with center frequency correction.

The adverse effects of drift in the nominally static magnetic field are perhaps most noticeable when a number of complete scan sequences are performed in a complex sequential "study" of what are supposed to be the same slice volumes from the patient. For example, one scan could be performed so as to obtain an image of given slice volumes with one setting for the MRI TE and TR parameters while other subsequent scans of the same slice volumes would be obtained with different settings for the TR and TE parameters. By studying a sequence of R such scans of the same slice, it may be possible to perceive additional information concerning a potential anomaly in the image. However, if the static field intensity drifts over the course of these R scans, then the actual center slice location may also shift as depicted in FIG. 5 if the RF transmitter continues to use the same center frequency for all of the scans. As can be appreciated, if the drift is sufficiently severe, the results could be a significant form of artifact in the multiple scan study of a given slice.

However, if the center frequency of the RF transmitter is reajusted or reset at the beginning of each scan (e.g., based upon calibration data taken from the just-preceding scan or from an initial "calibration" measurement cycle), then the actual location of the slice volumes throughout the R scans may be maintained with more accuracy and consistency as depicted in the lower portion of FIG. 5.

Figure 6:
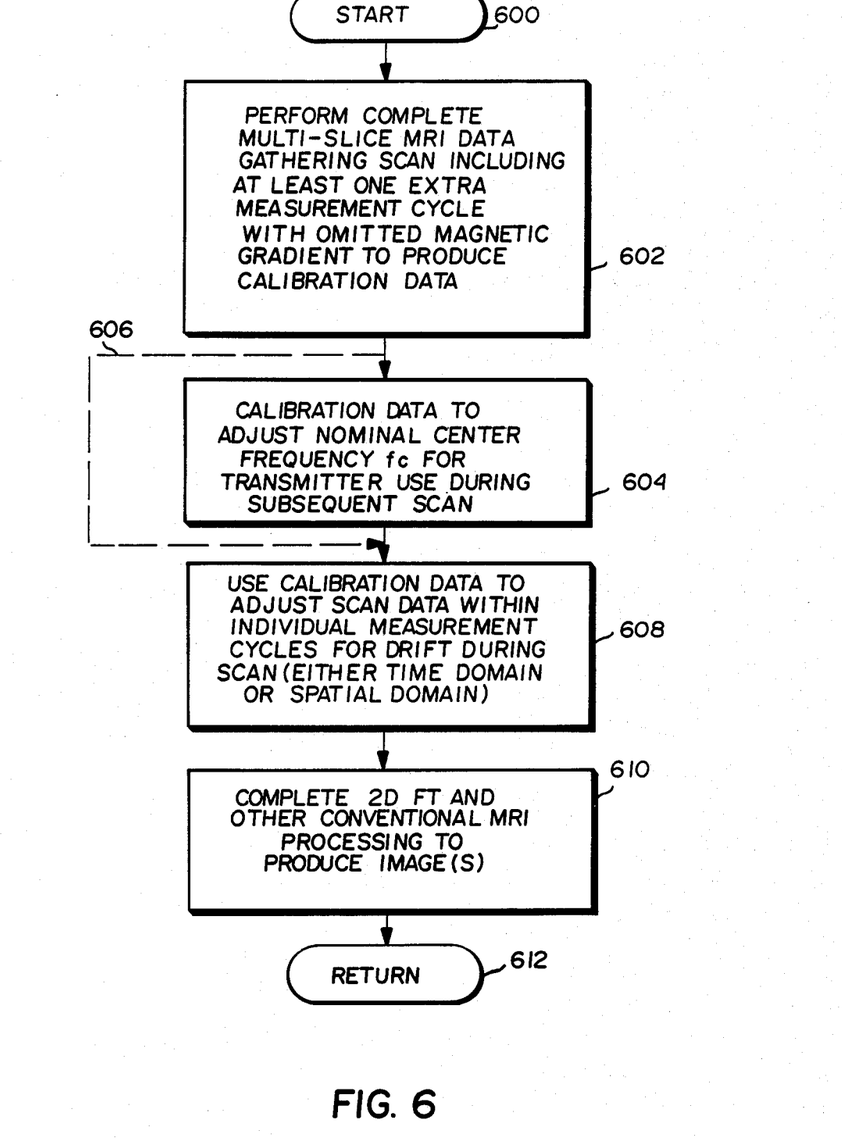
FIG. 6 is a simplified flow chart of computer program modifications for the exemplary embodiment.

As already mentioned, there are numerous ways to implement various aspects of this invention. For example, one exemplary implementation is depicted in the flowchart of FIG. 6. Here, the program of a conventional MRI system is entered at 600 and a complete multi-slice MRI data gathering scan is performed at 602 in accordance with conventional practice —but also including at least one extra measurement cycle (see FIG. 3) with at least one omitted magnetic gradient pulse so as to produce extra calibration data.

At block 604, the calibration data may be used to adjust the nominal center frequency $f_c$ for the RF transmitter of the MRI system to use during subsequent measurement cycles (e.g., the next scan to be performed in a sequence of scans). Thereafter, (or alternatively via bypass 606), the calibration data may be used at block 608 to adjust already recorded scan data within the individual measurement cycles of a given scan for drift and/or remnant eddy current effects occurring during the scan. This adjustment may be performed either in the time domain or the spatial domain —and may be performed prior to the adjustment of the nominal center frequency if desired.

Thereafter, the conventional multi-dimensional Fourier Transformation process is completed at block 610 (if the scan data has been adjusted at block 608 in the spatial domain, at least one dimension of Fourier Transformation may have already taken place) followed by other conventional MRI processing so as to produce final images on a CRT screen (or for digital storage and later display). Thereafter, a return to the normal program processes of the MRI system is taken at block 612.

The extra "calibration" measurement cycle(s) with omitted readout and phase encoding $G_x$ and $G_y$ magnetic gradients may be thought of as a sort of template. As previously explained, templates may be acquired, for example, at both the beginning and end of a given scan sequence and respectively termed "first template" and "last template." In the course of a multi-scan study, after steady state conditions have been achieved, it may be preferable to use both the first and last templates to calculate the change over a given scan (see FIG. 4) based on a linear or other more complex model.

However, it is also been noted that the first template in the first scan of a given multi-scan study may provide somewhat misleading initial calibration points. Although the exact cause of this phenomenon is difficult to describe precisely, it may be because of some slow thermal response in the gradient power supplies or because the eddy currents themselves take some time to stabilize into a steady state repetitive regimen.

Accordingly, in the presently preferred exemplary embodiment, it has been discovered that one may use only the last template (in conjunction with known initialization data at the beginning of the scan) to provide significant calibration data for at least the first scan of a multi-scan study. By the time the last template is taken, the operation of the gradient power supplies and/or the effects of the remnant eddy currents appear to have stabilized.

Figure 7:
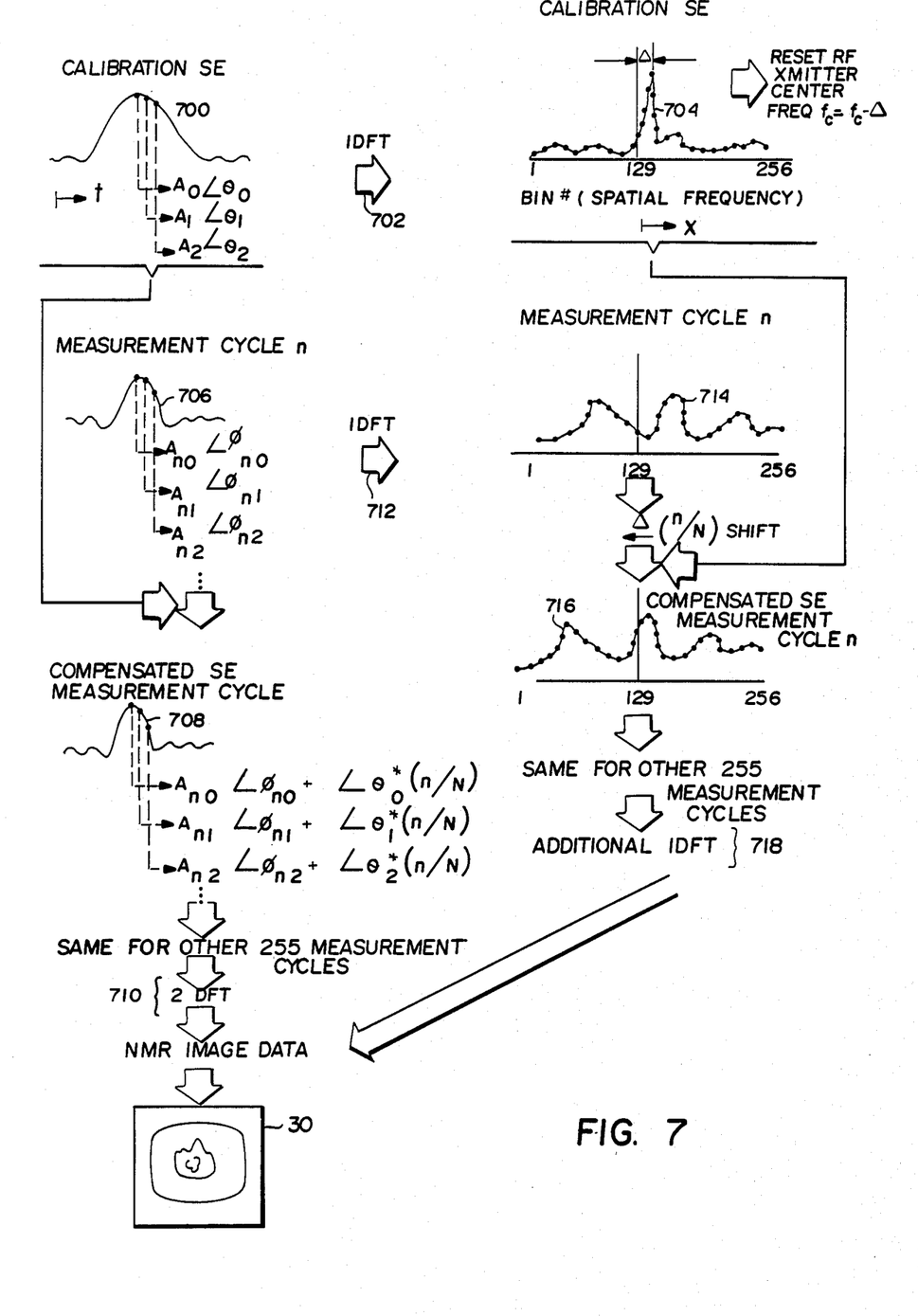
FIG. 7 is a graphic depiction of calibration and correction processes which may be employed in the exemplary embodiment (in both the time and spatial frequency domains)

FIG. 7 provides a schematic pictorial depiction of presently preferred exemplary embodiments for achieving calibration using the last template calibration data. Here, the time domain spin echo data for the last template is depicted at 700. As will be appreciated, the envelope 700 is actually represented by a succession of stored digital data representing the amplitude A and relative phase 8 of each of successive sampling points measured by suitable analog-to-digital converter apparatus during the actual occurrence of the time domain spin echo of the last template.

Through a one dimensional Fourier Transform at 702, the discrete time domain data 700 can be transformed o the frequency domain and "binned" at locations corresponding to 256 discrete frequencies. Bin number 129 has been selected as the "center" of this frequency domain. The frequency corresponding to bin number 129 is, at the beginning of a scan sequence, defined so as to be at the middle of the x-axis field of view (based upon the spectrum of frequencies elicited in the initial NMR RF response from this planar volume). When a calibration measurement cycle occurs (without readout gradient), the NMR RF response should consist of a very narrow band of frequencies and substantially zero relative phase shift. However, due to spurious changes in the magnetic fields over the course of a complete scan sequence, the last template will likely have a peak in the spatial frequency domain that is offset from the center bin 129 by some measurable amount $\Delta$ as depicted in FIG. 7. To recenter this system in preparation for subsequent measurement cycles, the RF transmitter center frequency $f_c$ can then be reset by the measured amount $\Delta$. Among other possible improvements, such resetting also tends to keep the z-axis location of selected slice volumes relatively constant for subsequent scan sequences.

The original time domain spin echo data 706 is also depicted in FIG. 7 for a typical measurement cycle n of the N measurement cycles of a complete single scan sequence. This original time domain data may be compensated to provide compensated data 708 by performing suitable phase corrections based upon the last template data (assuming a linear change over all N measurement cycles) as depicted in FIG. 7 before performing the usual multi-dimensional Fourier Transformation at 710 to produce NMR image data and a display at 30.

Alternatively, so as to avoid the need for a lot of complex number multiplications (which may be unduly time consuming), the original time domain spin echo data 706 may undergo one dimension of Fourier Transformation at 712 to produce a corresponding set of spin echo data 714 in the spatial domain. Here, the necessary phase correction may be achieved by a simple shift or translation in the spatial domain to produce compensated spin echo data 716. After this same sort of correction has been effected for the requisite 256 measurement cycles (assuming 256 lines of y-axis resolution and no synthesized data), an additional dimension of Fourier Transformation is performed at 718 to produce NMR image data which can again be reused to produce essentially the same image at 30.

To summarize, in the just described exemplary embodiment, the last template is used (in conjunction with the known nominal center frequency set at the beginning of the scan) to readjust the center frequency of the RF transmitter for subsequent data measurement cycles. One dimension of Fourier Transformation is performed on the raw time domain template data, the peak magnitude is located in the spatial frequency domain and its offset from the center bin (e.g., 129) is measured as the required adjustment in the then existing RF transmitter center frequency. This required offset may be stored or otherwise communicated to the control computer 24 before the next measurement cycle sequence is undertaken.

The measured frequency shift $\Delta$ of the Fourier Transformed last template is also equivalent to a pixel shift in the image. One or more templates may be used (e.g., with linear or higher order interpolation of drift calculated from the measured peaks in the spatial domain). Once the offset from the center bin in the spatial domain has been determined, the lDFT pixel data (actually representing a phase encoded column along the y-axis at a given x-axis location) is merely "scrolled" (i.e., translated or shifted) in the proper direction by the number of pixels needed to recenter the template to within the nearest one pixel dimension (i.e., the shifted position is rounded to the nearest pixel location).

A more complex and accurate phase correction can be achieved in the time domain. As depicted in FIG. 7, this involves complex number multiplication which is slower than scrolling —but it provides an added benefit.

While scrolling in the frequency domain may adequately correct for phase error due to field drift, the more accurate phase corrections in the time domain will more accurately compensate for remnant eddy current effects as well. Accordingly, by performing compensation in the time domain, artifact from phase errors of all types may be more accurately compensated. This may be especially useful, for example, where some of the spin echo data is synthesized based upon assumed complex conjugate symmetries —and which process is thus very sensitive to phase errors. Here, as depicted in FIG. 7, a vector is stored containing the complex conjugate of the measured template phase angle $\theta$. Each data point to be compensated must then be multiplied in the time domain by this compensation vector. Such precise phase corrections in the time domain may also be useful for reducing artifact when flowing substances are being imaged or when water and fat or other substances are being separated by use of the phase changes that can be produced due to their slightly different NMR frequencies (e.g., 3.5 ppm difference).

It should also be noted that in prior art techniques for synthesizing data based upon complex conjugate symmetry, another type of phase correction is conventionally utilized. Here, the zero $G_y$ phase encoded measurement cycle is used and the signal at the peak of the spin echo is examined. All samples are shifted so that the peak is located at the center of the time domain sampling window. Then, the measured relative phase of all the samples are shifted by similar amounts so as to force the phase at the center to be zero (i.e., all real and no imaginary part). The same time and phase shifts then are applied to all other measured data for a given scan of a given slice. As will be appreciated, the calibration phase shifts and other corrections employed in this invention are achieved in a different fashion, based upon different data and used for different purposes.

The phase correction template may be especially useful for gradient reversal "echoes" (really a recalled FID). In this case, it may be important since the phase of the echo is not fully "cleaned up" by a 180° RF pulse and any magnet inhomogeneities distort the echo. This type "echo" is sometimes better called an FID.

In some of the superconducting magnets there also may be another effect. Gradient pulsing causes a dynamic or transient change of the field strength. In some way (perhaps by exerting forces on the magnet winding that moves it around in the cryostat) the pulsing gradients cause the field to change to a new value while the scan is running. Once the gradient pulses stop the field returns to the pre-existing quiescent value. This dynamic change is repeatable for the same gradient pulses and is different when different shape, duration or direction pulses are used. Thus, a correction is needed when scans of the same orientation are used where some gradient parameters change and one wants the images from the different scans to register with one another.

The phase correction for eddy currents requires more accuracy and precision than correction for field drift. The previously described embodiments work best (insofar as eddy currents are concerned) on relatively small image volumes having an NMR spectrum consisting of a single absorption line. Where there are more substantial field inhomogeneities and/or chemical shift effects, such influences are best removed (or at least reduced) before making phase shift corrections to compensate for eddy current effects.

One approach is to acquire two sets of calibration data —one with slice gradients in normal polarity (e.g., as in FIG. 3) and a second with all polarities inverted. The adverse effects caused by field inhomogeneity remain the same while those caused by remnant eddy currents change in sign. Thus, by subtracting one data set's phase from the phase of the other data set, the inhomogeneity errors cancel and, if the result is divided by two, the result is the sought-after phase error due to eddy currents alone. This gradient reversal approach is depicted in FIG. 9.

Figure 9:
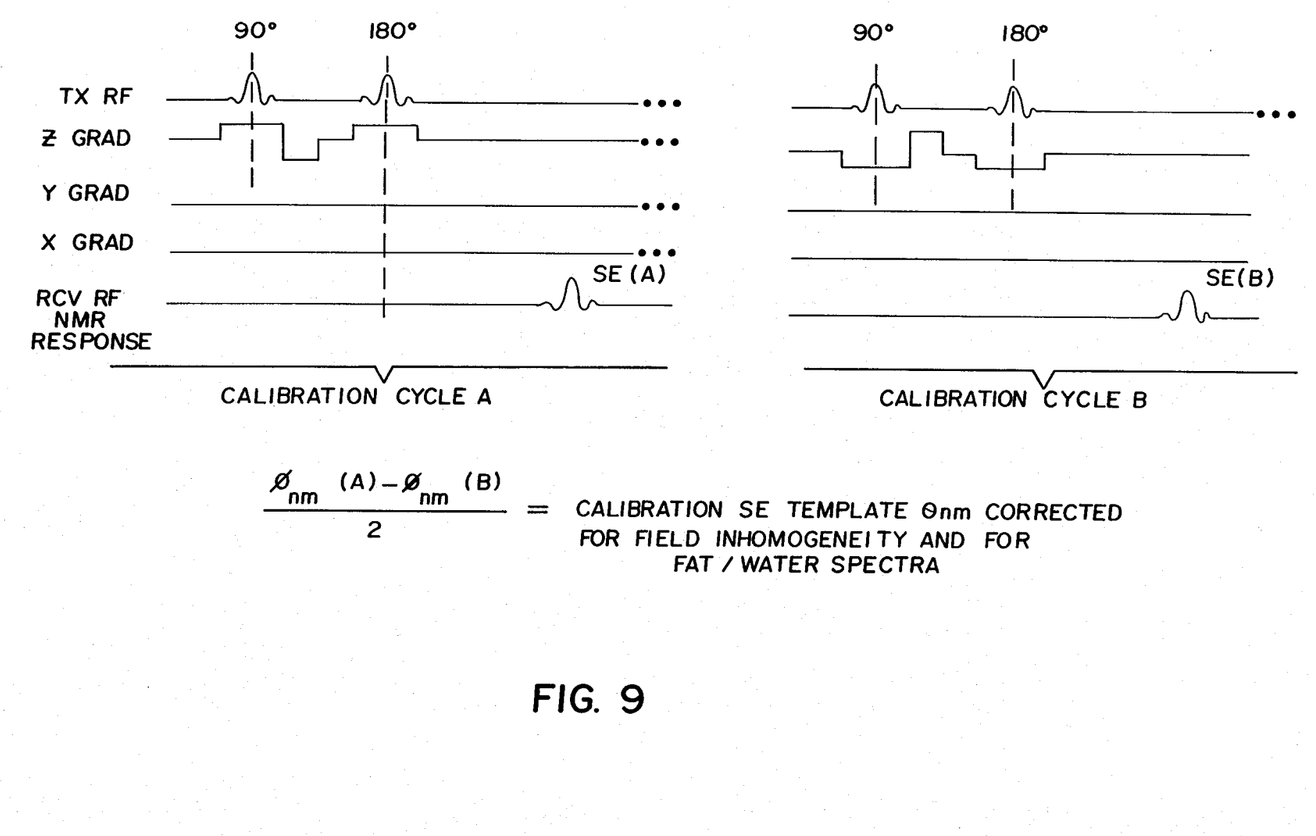
FIG. 9 is a schematic depiction of a pair of calibration cycles using slice gradient polarity reversal to derive a calibration template having reduced anomolies caused by field inhomogeneities and/or differences in fat and water NMR spectra.

Chemical shift between the water and the fat of body tissue is invariant to gradient polarity changes (and thus the correction process depicted in FIG. 9 removes chemical shift errors). However, it differs from field inhomogeneity in at least one respect. The shift causes water and fatty tissue to be selected from two different slices, slightly shifted with respect to each other. The direction of the slice's shift in position also changes sign when gradient polarities are inverted. So, if the two calibration data sets are therefore not collected from a single, well-defined slice of the object, the difference will then also contain any mismatch between them, which may invalidate the calibration data.

Figure 8:
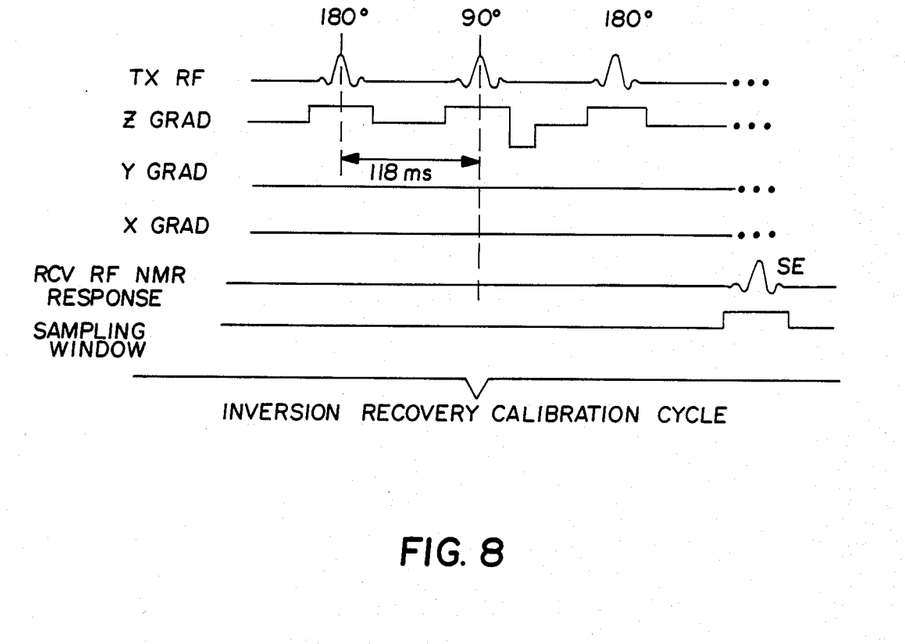
FIG. 8 is a schematic depiction of a calibration cycle using an inversion recovery procedure to derive corrected template data.

Therefor, we propose, in one preferred exemplary embodiment, to null out the fatty component by a selective presaturation pulse, before acquiring each of the calibration data sets. A 180° pulse with a suitabe delay is a good candidate for presatuation. This procedure is depicted in FIG. 8.

As shown in FIG. 9, one may make two calibration cycle measurements, first with normal slice selection gradient polarities and then with all polarities reversed. The effects of the eddy currents have the same reversible polarity as the gradient excitation, but the frequency relation of fat and water is the same in both cases. Thus, a combination of the phase of the two signals will provide cancellation that leaves one with a consistent calibration template.

For example, let SE(+) and SE(−) be the calibration data collected with positive and negative gradient polarities respectively. Then the eddy current correction template is given by:

Magnitude of template = 1

Template phase = [phase SE(+) − phase SE(−)]/2

Multiplying each recorded data point for each "line" of the conventional spin echo data set by the complex conjugate of the corresponding data point of the template then reduces the phase distortion caused by eddy currents.

When one wants to accurately correct for remnant eddy currents, then an inversion recovery calibration cycle may be run as depicted in FIG. 8. Here we seek to establish a template for phase correction from human tissue having two different frequency sources: fat and water. At 15 MHz fat and water have NMR frequencies which differ by about 50 Hz. The result is that the spectrum of a single template is not from a single resonance line and as one moves away from the peak of the spin echo, signal phase is confused by mixture of the signals having these different frequencies.

One approach to eliminate such confusion is to use an inversion recovery sequence as depicted in FIG. 8 where the timing is such that one of the two interfering signals is zero when the other is being recorded. This depends on a consistent value of T1 for one of the two tissues. Using a time-to-inversion TI of 118 msec is known to null fat NMR signals at 15 MHz.

Figure 10:
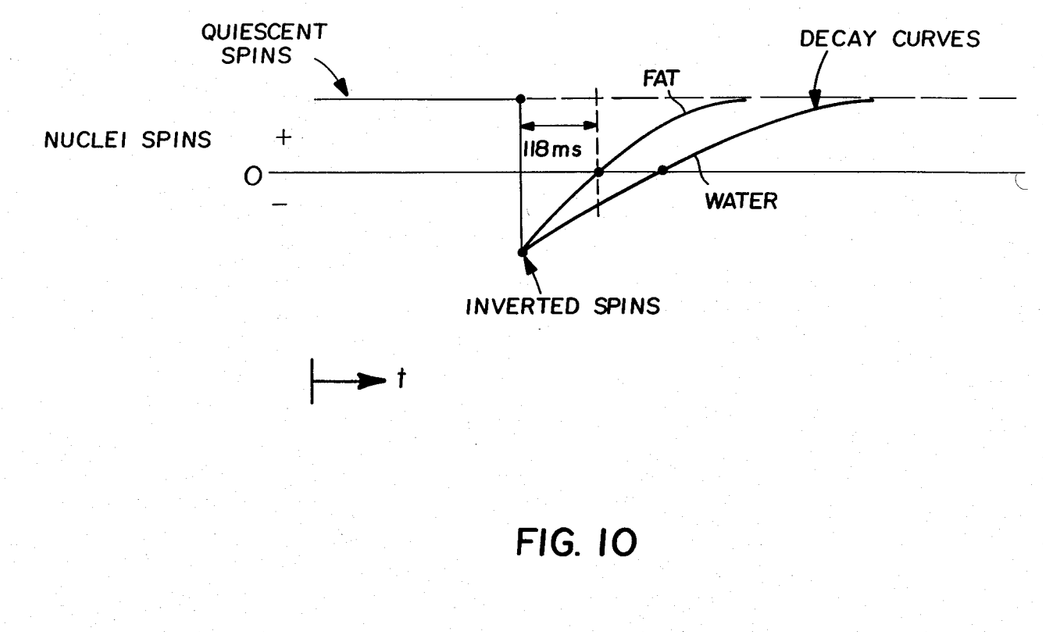
FIG. 10 is a diagram illustrating the different T1 decay factors for fat and water which make it possible to selectively null one from the other by judicious choice of TI in an inversion recovery procedure.

For example, as depicted in FIG. 10, if the quiescent spins are inverted by a 180° RF nutation pulse, fat nuclei relax back toward the quiescent with a shorter time constant than do those having a more water-like constitution. Experience has shown that the fat nuclei spins will have a zero z magnetization (i.e., zero in FIG. 10) about 118 milliseconds after inversion (i.e. T1 for fat multiplied by ln 2). Thus, if a TI parameter of 118 ms is used in an inversion recovery sequence, the fat nuclei NMR signal sources are effectively masked out.

These FIGS. 8 and 9 sequences have a common feature in that they typically may be different from the actual data acquisition cycle by more than just the elimination of the readout and phase encoding gradients. The inversion recovery (FIG. 8) is a different excitation sequence that depends on the different T1 values for fat and water for signal zeroing of the fat component. If P commands are used, it would require its own unique P command to run. It may be done as a separate calibration data acquisition cycle possibly separated further in time from the usual image data acquisition scan sequence (e.g. than shown in the FIG. 3 embodiment) —especially with a superconducting magnet where eddy current compensation is the principal goal.

The reversed gradient scheme (FIG. 9) acquires two different data sets and also may be effected via a unique P command. It has an additional complexity since when the slice gradient polarity is reversed the excitation frequencies for off center slices also have to be reversed. Thus it is easier to do if one already has established a precisely correct center slice frequency. Otherwise the plus and minus gradient-defined slices may not quite match.

While only a few presently preferred exemplary embodiments of this invention have been described in detail, those skilled in the art will appreciate that there are many possible variations and modifications of these embodiments which still retain many of their novel features and advantages. Accordingly, all such modifications and variations are intended to be included within the scope of the appended claims.

We claim:

1. In a magnetic resonance imaging method which gathers NMR image data over a sequence of measurement cycles during which first magnetic gradient pulses are superimposed on a nominally static magnetic field to selectively address NMR RF excitations for at least one predetermined volume and second magnetic gradient pulses are superimposed on said static field at other times in a measurement cycle, the improvement comprising:
    performing at least one further of said measurement cycles during which at least one of said second gradient pulses is omitted so as to produce calibration data representative of the magnetic field then existing in said predetermined volume; and
    using said calibration data to produce MRI data compensated for errors which otherwise would be present due to undesirable changes with respect to time in the magnetic field actually present in said predetermined volume.

2. An improved magnetic resonance imaging method as in claim 1 wherein said performing step is performed at least once before said sequence of measurement cycles.

3. An improved magnetic resonance imaging method as in claim 1 wherein said performing step is performed at least once after said sequence of measurement cycles.

4. An improved magnetic resonance imaging method as in claim 1 wherein said performing step is performed at least once both before and after said sequence of measurement cycles.

5. An improved magnetic resonance imaging method as in claim 1 wherein said performing step is performed at least once within said sequence of measurement cycles.

6. An improved magnetic resonance imaging method as in claim 1 wherein said using step includes the step of resetting the RF frequency of said NMR RF excitations used in subsequent measurement cycles of the same or subsequent sequence of measurement cycles.

7. An improved magnetic resonance imaging method as in claim 1 wherein said using step includes the step of shifting the spatial location of one dimensionally Fourier Transformed NMR data prior to a second dimension of Fourier Transformation sufficiently to effect a frequency/phase correction for the magnetic fields produced by eddy currents induced by at least said first magnetic gradient pulses.

8. An improved magnetic resonance imaging method as in claim 7 wherein said using step includes the step of resetting the RF frequency of said NMR RF excitations used in subsequent measurement cycles of the same or subsequent sequence of measurement cycles.

9. An improved magnetic resonance imaging method as in claim 1 wherein said using step includes the step of phase-shifting NMR data in the time domain prior to Fourier Transformation sufficient to effect a frequency/phase correction for the magnetic fields produced by eddy currents induced by at least said first magnetic gradient pulses.

10. An improved magnetic resonance imaging method as in claim 9 wherein said using step includes the step of resetting the RF frequency of said NMR RF excitations used in subsequent measurement cycles of the same or subsequent sequence of measurement cycles.

11. A magnetic resonance imaging method comprising the steps of:
    recording first NMR responses elicited during a sequence of measurement cycles in which magnetic gradient pulses are superimposed on a nominally static magnetic field during said recording and producing NMR image data from said first NMR responses;
    eliciting and further recording NMR responses during at least one calibration cycle similar to one of said measurement cycles wherein no magnetic gradient pulses are employed during said further recording; and
    using said further NMR responses to produce NMR image data compensated for unwanted changes in magnetic fields which may occur during said recording step.

12. A magnetic resonance imaging method as in claim 11 wherein said using step includes resetting an RF NMR excitation frequency used in subsequent measurement cycles.

13. A magnetic resonance imaging method as in claim 11 wherein said using step includes phase shifting said recorded NMR responses in the time domain.

14. A magnetic resonance imaging method as in claim 11 wherein said using step includes shifting said recorded NMR responses in the spatial domain after at least one dimension of Fourier Transformation.

15. A magnetic resonance imaging method as in claim 12 wherein said using step includes phase shifting said recorded NMR responses in the time domain.

16. A magnetic resonance imaging method as in claim 12 wherein said using step includes shifting said recorded NMR responses in the spatial domain after at least one dimension of Fourier Transformation.

17. In a magnetic resonance imaging system which gathers NMR image data over a sequence of measurement cycles during which first magnetic gradient pulses are superimposed on a nominally static magnetic field to selectively address NMR RF excitations for at least one predetermined volume and second magnetic gradient pulses are superimposed on said static field at other times in a measurement cycle, the improvement comprising:
    means for performing at least one further of said measurement cycles during which at least one of said second gradient pulses is omitted so as to produce calibration data representative of the magnetic field then existing in said predetermined volume; and
    means for using said calibration data to produce MRI data compensated for errors which otherwise would be present due to undesirable changes with respect to time in the magnetic field actually present in said predetermined volume.

18. An improved magnetic resonance imaging system as in claim 17 wherein said means for performing is actuated at least once before said sequence of measurement cycles.

19. An improved magnetic resonance imaging system as in claim 17 wherein said means for performing is actuated at least once after said sequence of measurement cycles.

20. An improved magnetic resonance imaging system as in claim 17 wherein said means for performing is actuated at least once both before and after said sequence of measurement cycles.

21. An improved magnetic resonance imaging system as in claim 17 wherein said means for performing is actuated at least once within said sequence of measurement cycles.

22. An improved magnetic resonance imaging system as in claim 17 wherein said means for using includes means for resetting the RF frequency of said NMR RF excitations used in subsequent measurement cycles of the same or subsequent sequence of measurement cycles.

23. An improved magnetic resonance imaging system as in claim 17 wherein said means for using includes means for shifting the spatial location of one dimensionally Fourier Transformed NMR data prior to a second dimension of Fourier Transformation sufficiently to effect a frequency/phase correction for the magnetic fields produced by eddy currents induced by at least said first magnetic gradient pulses.

24. An improved magnetic resonance imaging ststem as in claim 23 wherein said means for using includes means for resetting the RF frequency of said NMR RF excitations used in subsequent measurement cycles of the same or subsequent sequence of measurement cycles.

25. An improved magnetic resonance imaging system as in claim 17 wherein said means for using includes means for phase-shifting NMR data in the time domain prior to Fourier Transformation sufficient to effect a frequency/phase correction for the magnetic fields produced by eddy currents induced by at least said first magnetic gradient pulses.

26. An improved magnetic resonance imaging system as in claim 25 wherein said means for using includes means for resetting the RF frequency of said NMR RF excitations used in subsequent measurement cycles of the same or subsequent sequence of measurement cycles.

27. A magnetic resonance imaging system comprising
    means for recording first NMR responses elicited during a sequence of measurement cycles in which magnetic gradient pulses are superimposed on a nominally static magnetic field during recording of the first NMR responses and means for producing NMR image data from said first NMR responses;
    means for eliciting and further recording NMR responses during at least one calibration cycle similar to one of said measurement cycles wherein no magnetic gradient pulses are employed during said further recording; and
    means for using said further NMR responses to produce NMR image data compensated for unwanted changes in magnetic fields which may occur during said recording.

28. A magnetic resonance imaging system as in claim 27 wherein said means for using includes means for resetting an RF NMR excitation frequency used in subsequent measurement cycles.

29. A magnetic resonance imaging system as in claim 27 wherein said means for using includes means for phase shifting said recorded NMR responses in the time domain.

30. A magnetic resonance imaging system as in claim 27 wherein said means for using includes means for shifting said recorded NMR responses in the spatial domain after at least one dimension of Fourier Transformation.

31. A magnetic resonance imaging system as in claim 28 wherein said means for using includes means for phase shifting said recorded NMR responses in the time domain.

32. A magnetic resonance imaging system as in claim 28 wherein said means for using includes means for shifting said recorded NMR responses in the spatial domain after at least one dimension of Fourier Transformation.

33. In a magnetic resonance imaging method of the type which gathers NMR image data from an imaged volume over a sequence of measurement cycles and having a nominally constant magnetic field component superimposed in said volume, the improvement comprising:
    performing at least one further calibration NMR measurement wherein an NMR inversion recovery cycle is effected to produce an NMR RF response substantially without chemical shift artifact and in the absence of applied magnetic gradients to produce calibration data; and
    using said calibration data to produce MRI data compensated for errors which otherwise would be present due to undesirable changes with respect to time in the magnetic field actually present in said imaged volume.

34. An improved magnetic resonance imaging method as in claim 33 wherein said inversion recovery cycle uses a TI of about TI for a predetermined type of nuclei multiplied by ln 2 to substantially null the spectra of said predetermined type nuclei from said NMR RF response.

35. In a magnetic resonance imaging method of the type which gathers NMR image data from an imaged volume over a sequence of measurement cycles and having a nominally constant magnetic field component superimposed in said volume, the improvement comprising:
performing at least one pair of further calibration measurement cycles wherein the polarity of slice selective magnetic gradient pulses utilized in one cycle is reversed for another cycle and wherein the respectively corresponding phases of measured NMR RF responses obtained in said pair of cycles is subtracted to provide calibration data substantially without chemical shift artifact and in the absence of applied magnetic gradients to produce calibration data; and
using said calibration data to produce MRI data compensated for errors which otherwise would be present due to undesirable changes with respect to time in the magnetic field actually present in said imaged volume.

36. An improved magnetic resonance imaging method as in claim 35 wherein the resultant subtracted phase calues are divided by two produce said calibration data.

* * * * *